(12) United States Patent
Kanike et al.

(10) Patent No.: US 10,355,134 B2
(45) Date of Patent: Jul. 16, 2019

(54) METAL-OXIDE SEMICONDUCTOR (MOS) DEVICE WITH THICK OXIDE

(71) Applicant: QUALCOMM Incorporated, San Diego, CA (US)

(72) Inventors: Narasimhulu Kanike, San Diego, CA (US); Qingqing Liang, San Diego, CA (US); Fabio Alessio Marino, San Marcos, CA (US); Francesco Carobolante, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 2 days.

(21) Appl. No.: 15/602,915

(22) Filed: May 23, 2017

(65) Prior Publication Data

US 2018/0342620 A1 Nov. 29, 2018

(51) Int. Cl.
| | | |
|---|---|---|
| *H01L 29/78* | (2006.01) | |
| *H01L 23/522* | (2006.01) | |
| *H01L 23/528* | (2006.01) | |
| *H01L 29/66* | (2006.01) | |
| *H01L 29/06* | (2006.01) | |
| *H01L 27/08* | (2006.01) | |
| *H01L 27/092* | (2006.01) | |
| *H01L 29/93* | (2006.01) | |

(52) U.S. Cl.
CPC ...... *H01L 29/7851* (2013.01); *H01L 23/5226* (2013.01); *H01L 23/5283* (2013.01); *H01L 27/0805* (2013.01); *H01L 27/0924* (2013.01); *H01L 29/0649* (2013.01); *H01L 29/66795* (2013.01); *H01L 29/7855* (2013.01); *H01L 29/93* (2013.01)

(58) Field of Classification Search
CPC .............. H01L 29/7851; H01L 29/93; H01L 27/0924; H01L 29/7855; H01L 27/0805; H01L 29/66795; H01L 23/5283; H01L 23/5226; H01L 29/0649
See application file for complete search history.

(56) References Cited

U.S. PATENT DOCUMENTS

| | | | | |
|---|---|---|---|---|
| 6,768,158 B2* | 7/2004 | Lee | .................... | H01L 21/28273 257/315 |
| 6,800,905 B2* | 10/2004 | Fried | ................. | H01L 29/42384 257/351 |
| 7,120,046 B1* | 10/2006 | Forbes | ..................... | G11C 7/18 257/296 |

(Continued)

OTHER PUBLICATIONS

International Search Report and Written Opinion—PCT/US2018/024355—ISA/EPO—dated Jun. 25, 2018.

*Primary Examiner* — Jarrett J Stark
(74) *Attorney, Agent, or Firm* — Patterson & Sheridan, LLP

(57) ABSTRACT

Certain aspects of the present disclosure generally relate to a semiconductor device and techniques for fabricating a semiconductor device. In certain aspects, the semiconductor device includes a fin, a first non-insulative region disposed adjacent to a first side of the fin, and a second non-insulative region disposed adjacent to a second side of the fin. In certain aspects, the first non-insulative region and the second non-insulative region are separated by a trench, at least a portion of the trench being filled with a dielectric material disposed around the fin.

10 Claims, 8 Drawing Sheets

(56) References Cited

U.S. PATENT DOCUMENTS

| | | | |
|---|---|---|---|
| 7,432,122 B2* | 10/2008 | Mathew | H01L 27/0811 |
| | | | 257/E27.05 |
| 7,488,650 B2 | 2/2009 | Schulz | |
| 8,541,267 B2 | 9/2013 | Sonsky et al. | |
| 8,803,288 B1* | 8/2014 | Marino | H01G 7/00 |
| | | | 257/602 |
| 9,117,877 B2 | 8/2015 | Cai et al. | |
| 9,214,512 B2* | 12/2015 | Marino | H01L 29/0615 |
| 9,343,320 B2 | 5/2016 | Cheng et al. | |
| 9,601,381 B2 | 3/2017 | Loubet et al. | |
| 9,680,023 B1* | 6/2017 | Bao | H01L 29/7855 |
| 9,768,072 B1* | 9/2017 | Cheng | H01L 21/823487 |
| 2005/0104096 A1* | 5/2005 | Lee | H01L 21/823842 |
| | | | 257/288 |
| 2006/0227595 A1* | 10/2006 | Chuang | G11C 11/412 |
| | | | 365/154 |
| 2007/0111448 A1* | 5/2007 | Li | H01L 21/823821 |
| | | | 438/264 |
| 2007/0228491 A1* | 10/2007 | Forbes | H01L 29/0657 |
| | | | 257/401 |
| 2008/0157159 A1* | 7/2008 | Hook | H01L 29/93 |
| | | | 257/312 |
| 2008/0169495 A1 | 7/2008 | Orner et al. | |
| 2008/0230824 A1* | 9/2008 | Doornbos | H01L 21/28273 |
| | | | 257/315 |
| 2009/0026523 A1* | 1/2009 | Wong | H01L 21/845 |
| | | | 257/316 |
| 2009/0101940 A1* | 4/2009 | Barrows | H03K 19/1778 |
| | | | 257/204 |
| 2009/0206405 A1* | 8/2009 | Doyle | H01L 29/517 |
| | | | 257/365 |
| 2011/0068400 A1* | 3/2011 | Wang | G11C 11/412 |
| | | | 257/347 |
| 2011/0278676 A1* | 11/2011 | Cheng | H01L 21/823807 |
| | | | 257/369 |
| 2014/0197456 A1 | 7/2014 | Wang et al. | |
| 2015/0091100 A1* | 4/2015 | Xie | H01L 21/76224 |
| | | | 257/401 |
| 2015/0102392 A1* | 4/2015 | Yu | H01L 21/823431 |
| | | | 257/288 |
| 2015/0194538 A1* | 7/2015 | Marino | H01L 29/94 |
| | | | 327/530 |
| 2017/0236759 A1* | 8/2017 | Jagannathan | H01L 21/845 |
| | | | 257/392 |

* cited by examiner

US 10,355,134 B2

METAL-OXIDE SEMICONDUCTOR (MOS) DEVICE WITH THICK OXIDE

TECHNICAL FIELD

Certain aspects of the present disclosure generally relate to semiconductor devices and, more particularly, to metal-oxide semiconductor (MOS) devices.

BACKGROUND

An electronic device may use fin-type semiconductor devices. A fin-type semiconductor device may include a semiconductor region having protruding fins and one or more gate regions formed adjacent to the fins of the semiconductor region. One example of a fin-type semiconductor device is a fin field-effect transistor (FinFET). Digital logic circuits, for example, may be constructed using FinFET devices.

SUMMARY

Certain aspects of the present disclosure generally relate to a semiconductor device and techniques for fabricating the same.

Certain aspects of the present disclosure provide a semiconductor device. The semiconductor device generally includes a fin, a first non-insulative region disposed adjacent to a first side of the fin, and a second non-insulative region disposed adjacent to a second side of the fin. In certain aspects, the first non-insulative region and the second non-insulative region are separated by a trench, at least a portion of the trench being filled with a dielectric material disposed around the fin.

Certain aspects of the present disclosure provide a method for fabricating a semiconductor device. The method generally includes forming a semiconductor region comprising a fin, forming a first non-insulative region and a second non-insulative region adjacent to a first side and a second side of the fin, respectively, such that a trench is created around the fin, and filling at least a portion of the trench with a dielectric material.

Certain aspects of the present disclosure provide a mobile device. The mobile device generally includes one or more semiconductor devices, wherein each of the one or more semiconductor devices comprises a semiconductor region comprising a fin, a first non-insulative region disposed adjacent to a first side of the fin, and a second non-insulative region disposed adjacent to a second side of the fin, wherein the first non-insulative region and the second non-insulative region are separated by a trench, at least a portion of the trench being filled with a dielectric material disposed around the fin.

BRIEF DESCRIPTION OF THE DRAWINGS

So that the manner in which the above-recited features of the present disclosure can be understood in detail, a more particular description, briefly summarized above, may be by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Figure 1:
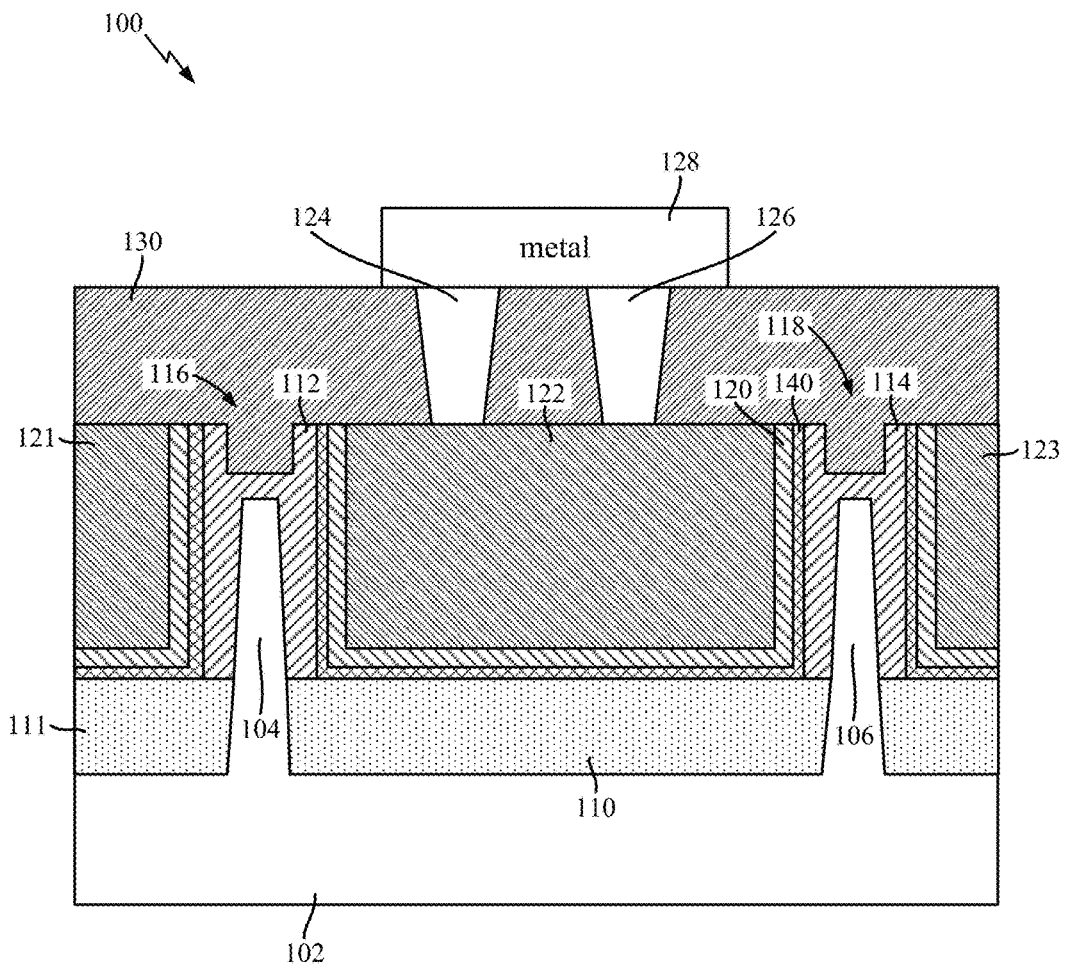
FIG. 1 illustrates a cross-section of an example semiconductor device, in accordance with certain aspects of the present disclosure.

Certain aspects of the present disclosure are generally directed to a semiconductor device, and techniques for fabricating the same. The techniques provided herein allow flexibility in setting the thickness of the gate dielectric to control the operating voltage of the semiconductor device.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

Recent planar and fin field-effect transistor (FinFET) based complementary metal-oxide semiconductor (CMOS) technologies offer metal-oxide semiconductor field-effect transistors (MOSFETs) and MOS capacitors operating up to 1.8 V-2.5V. However, certain system on chip (SoC) applications, radio-frequency (RF), power, high-voltage and non-volatile memory applications may need these devices to be able to withstand operating voltages beyond the standard voltages (e.g., more than 1.8 V-2.5V). In addition, some of these applications may use circuits operating with multiple supply voltages on the same die. Therefore, a CMOS process with multiple gate dielectric thicknesses and maybe with different types of dielectric films such as silicon dioxide, oxy-nitride and high dielectric constant materials (also known as high-K materials) may be used. However, because of the process complexity, cost, defects, and device instability issues, semiconductor manufacturers may use dual gate oxide processes for the recent technology nodes. Alternatively, high-voltage capability can also be achieved with certain complex circuit techniques but they also come with few drawbacks, such as, increasing die area, cost and higher design time.

Certain aspects of the present disclosure are generally directed to a process technique to form MOS fin devices (e.g., FETs, varactors, and variable capacitors) with thicker gate oxide, allowing for higher operating voltage of the MOS fin device beyond the standard devices offered in those process technologies. Instead of using additional processes such as patterning, dielectric formation, etching and cleaning, aspects of the present disclosure does not add any additional process costs. Further, the techniques provided herein allow for the control of the dielectric thickness by controlling the gate mask alignment with fin edge. This may enable devices to be implemented with multiple gate dielectric thicknesses, with a limit on the lower side by the gate patterning process. In addition, aspects of the present disclosure may be implemented for both silicon-on-insulator (SOI) and bulk process technologies. Moreover, aspects of the present disclosure allow for gate electrode dimensions of the semiconductor device to be engineered with increased fin-to-fin spacing at the cost of die area to reduce the gate parasitic resistance without degrading the device direct-current (DC) and low-frequency characteristics. This is particularly important for capacitors in radio-frequency (RF) applications where high Q is important without sacrificing tuning range.

FIG. 1 illustrates a cross-section of a semiconductor device 100, in accordance with certain aspects of the present disclosure. As illustrated, a semiconductor region 102 of the semiconductor device 100 includes fins 104 and 106. In certain aspects, the semiconductor region 102 and fins 104 and 106 may include silicon, germanium, silicon-germanium, or any other III-V compound semiconductor. The fins 104 and 106 are disposed in respective trenches 116 and 118 that are at least partially filled with dielectric materials 112 and 114. In certain aspects, the dielectric materials 112 and 114 may include silicon nitride, silicon oxide, or any low dielectric constant (also known as low-k) material such as carbon-doped nitride, or fluorine-doped oxide. The thickness of the trenches 116 and 118 may be controlled by controlling the gate mask when creating the gate regions (e.g., non-insulative regions 121, 122, and 123, thereby allowing flexibility in controlling the dielectric thickness around the fins 104 and 106. The semiconductor device 100 may include a dielectric layer 140, which may be implemented with high-k (HK) dielectric material, a work function metal layer 120, and a non-insulative region 122 (e.g., gate region) that may be implemented with a stack of seed metal and a low resistivity metal and is collectively referred as a metal gate (MG) region. In certain aspects, the dielectric layer 140 may include hafnium silicate, zirconium silicate, hafnium dioxide or zirconium dioxide. In certain aspects, the work function metal layer 120 may include tantalum, titanium, titanium nitride, or tantalum nitride. The non-insulative region 122 may be disposed above an insulative region 110 disposed between the fins 104 and 106. In certain aspects, the non-insulative regions 121, 122, and 123 may include stack of titanium aluminum/aluminum, tungsten or stack of titanium nitride/copper. One or more contacts 124 and 126 may be formed in an interlayer dielectric (ILD) material 130 to make contact between the non-insulative region 122 and a metal region 128, allowing for an electric connection to the non-insulative region 122. In certain aspects, the one or more contacts 124 and 126 may include tungsten or copper, and the metal region 128 may include copper. While examples provided herein are described with respect to a semiconductor device having two fins 104 and 106 to facilitate understanding, the semiconductor device described herein may be implemented with any number of fins.

Figure 2:
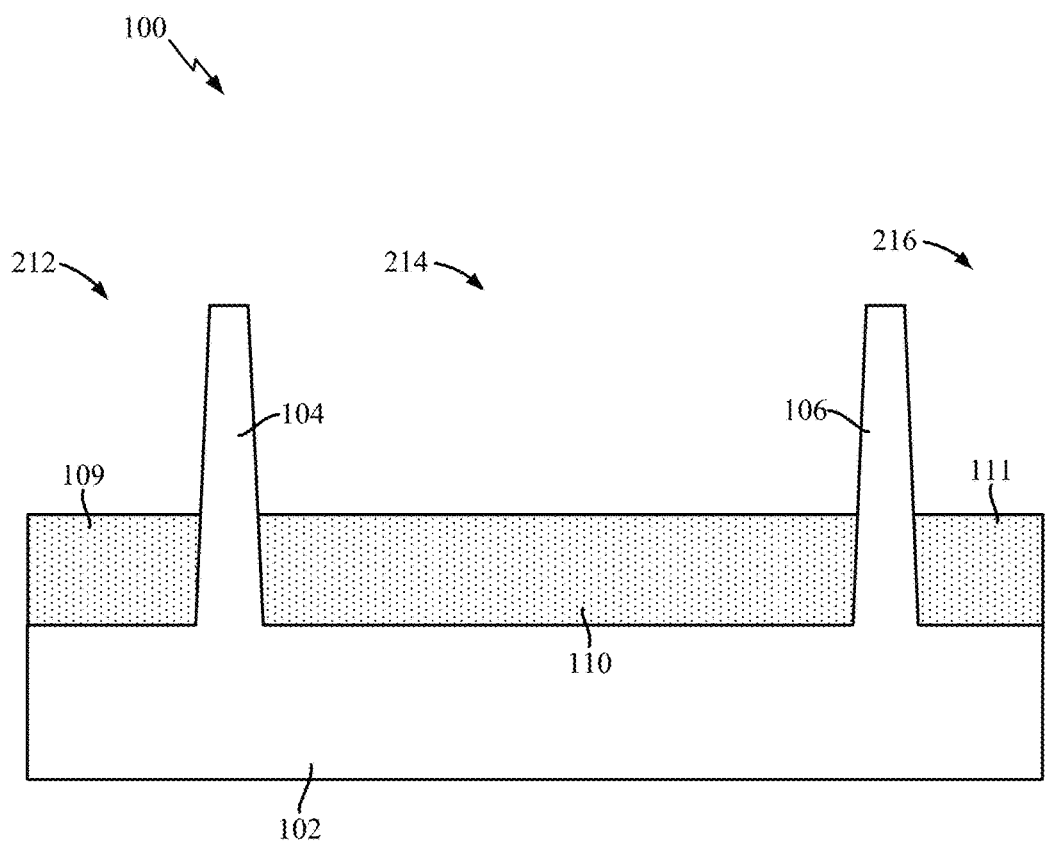
FIG. 2 illustrates a cross-section of an example semiconductor device after formation of a fin and shallow trench isolation (STI), in accordance with certain aspects of the present disclosure.

FIG. 2 illustrates a cross-section of the semiconductor device 100 after the formation of fins 104 and 106, in accordance with certain aspects of the present disclosure. At this stage, the semiconductor region 102 includes fins 104 and 106, and insulative regions 109, 110, and 111 may be formed adjacent to the fins 104 and 106, as illustrated. For example, the fins 104 and 106 may be formed by a series of processes, such as, mandrel deposition and patterning followed by a spacer deposition, etching, mandrel removal and by etching silicon to form two or more trenches 212, 214, and 216 in the semiconductor region 102. Subsequently, the trenches 212, 214, and 216 are filled using insulative material, followed by chemical-mechanical polishing (CMP) and selective etching of the insulative material in the trenches 212, 214, and 216 to form the insulative regions 109, 110, and 111.

Figure 3A:
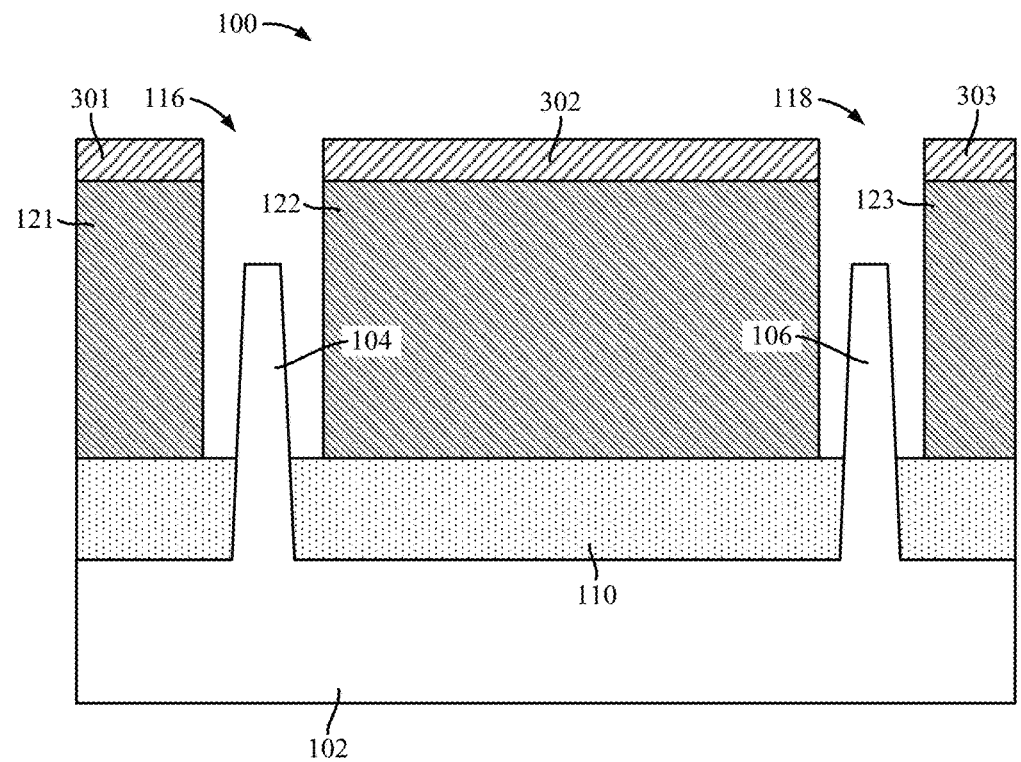
FIGS. 3A and 3B illustrate a cross-section and top-down view, respectively, of an example semiconductor device after poly gate deposition, poly chemical mechanical polishing (CMP), gate lithography, and etching process, in accordance with certain aspects of the present disclosure.
Figure 3B:
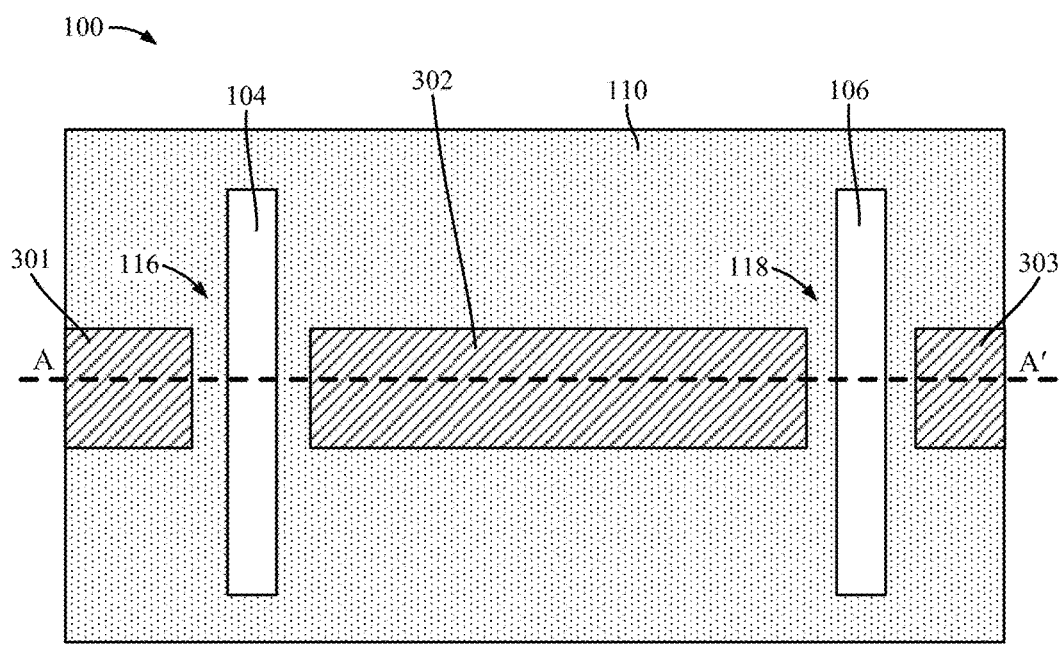

FIGS. 3A and 3B illustrate a cross-section and top-down view, respectively, of the semiconductor device 100 after formation of non-insulative regions 121, 122, and 123, in accordance with certain aspects of the present disclosure. FIG. 3A represents the cross-section taken through the line AA' in FIG. 3B. The gate mask used to form non-insulative regions 121, 122, and 123 may be controlled such that the fins 104 and 106 are disposed in respective trenches 116 and 118. At this point of the process, the non-insulative regions 121,123, and 123 may be formed using poly-silicon material, also known as dummy gate, that may later be replaced with a stack of High-K, work function metal and MG regions. Dielectric materials 301, 302, and 303 (e.g., silicon nitride) may be formed above respective non-insulative regions 121, 122, and 123 during the gate patterning process.

Figure 4A:
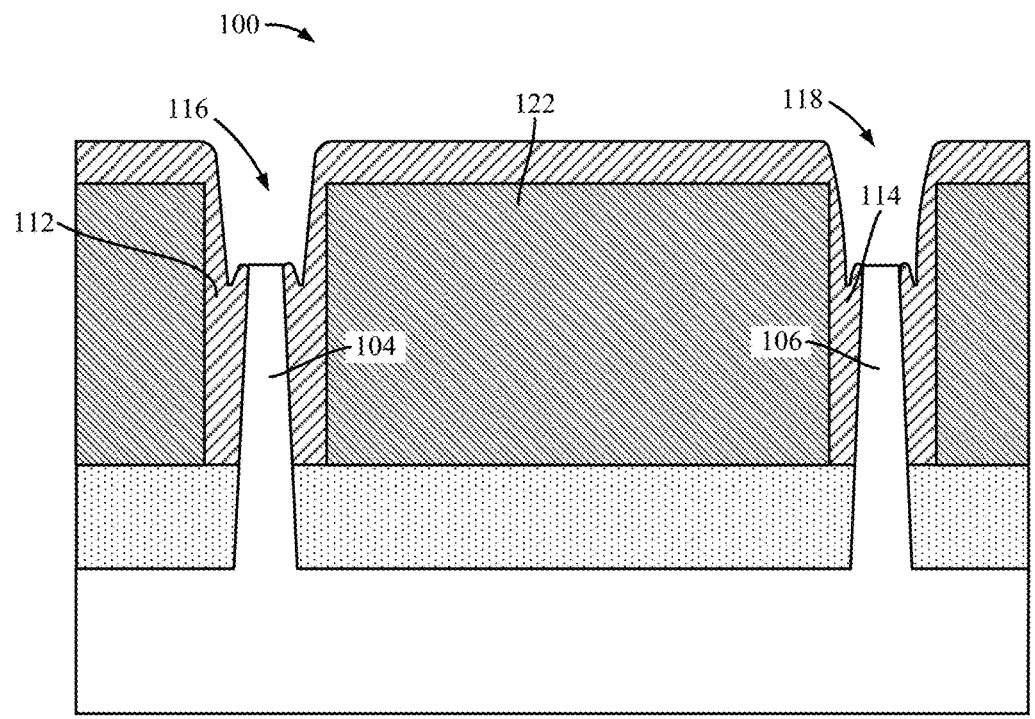
FIGS. 4A and 4B illustrate a cross-section and top-down view, respectively, of an example semiconductor device after re-oxidation, spacer deposition, and spacer etching, in accordance with certain aspects of the present disclosure.
Figure 4B:
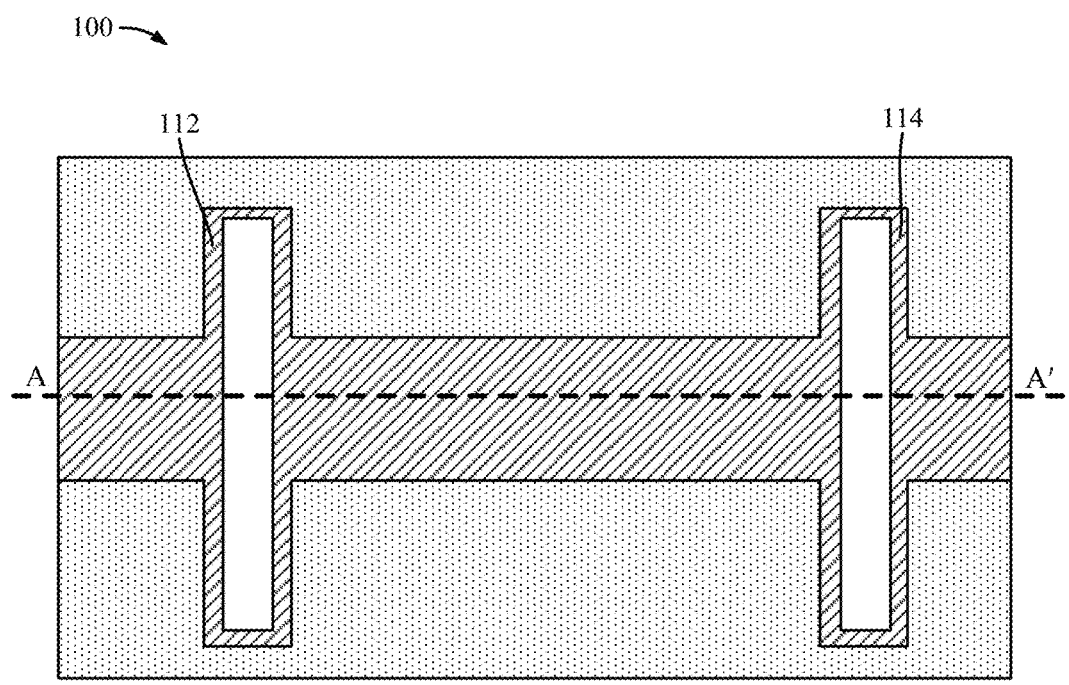

FIGS. 4A and 4B illustrate a cross-section and top-down view, respectively, of the semiconductor device 100 after trenches 116 and 118 have been partially filled with dielectric materials 112 and 114, in accordance with certain aspects of the present disclosure. FIG. 4A represents the cross-section taken through the line AA' in FIG. 4B. After polysilicon re-oxidation, a spacer deposition process may be carried out to deposit the dielectric materials 112 and 114, which may be followed by spacer etching, such that trenches 116 and 118 are partially filled with the dielectric materials 112 and 114. By changing the spacing between the non-insulative region 122 (e.g., dummy polysilicon gate) and the fins 104 and 106, it is possible to realize the semiconductor device 100 with different dielectric thicknesses.

Figure 5A:
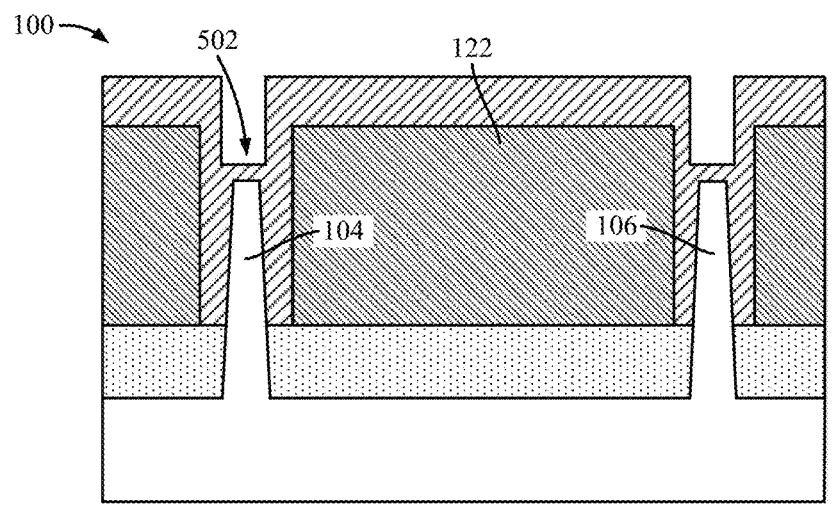
FIGS. 5A, 5B, and 5C illustrate cross-sections and a top-down view of an example semiconductor device after a source and drain epitaxy process, and spacer etching, in accordance with certain aspects of the present disclosure.
Figure 5B:
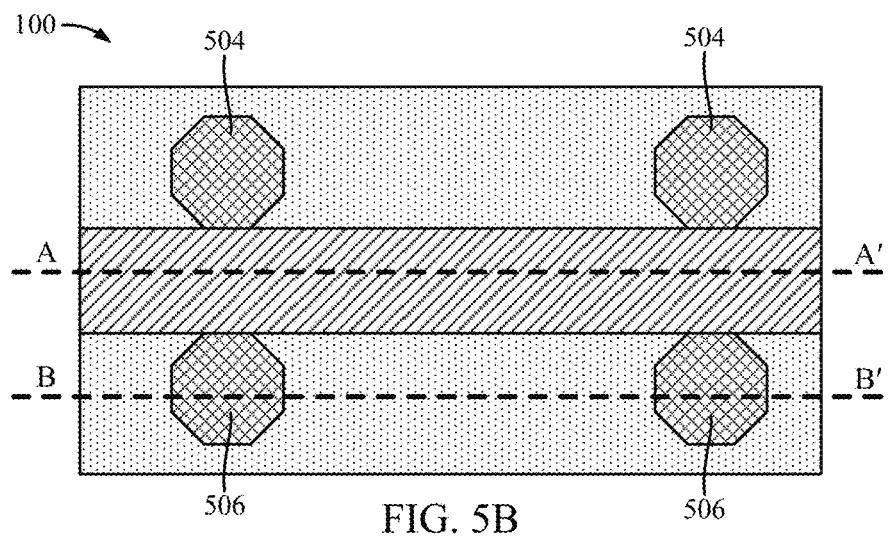
Figure 5C:
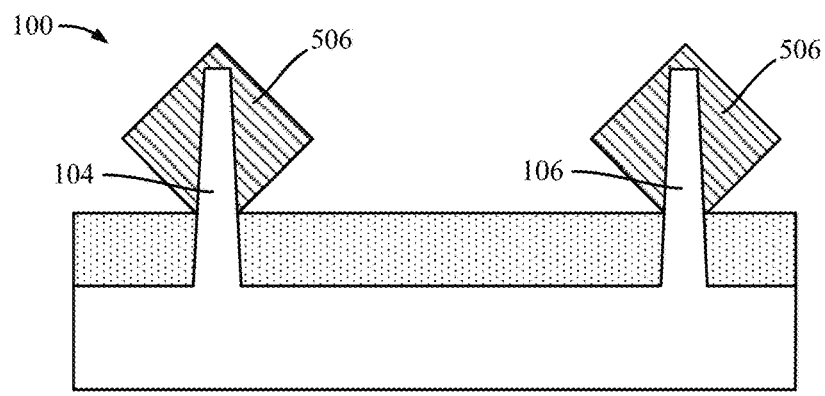

FIGS. 5A, 5B, and 5C illustrate cross-sections and a top-down view of the semiconductor device 100 after formation of source and drain regions 504 and 506, in accordance with certain aspects of the present disclosure. FIG. 5A represents the cross-section taken through the line AA' in FIG. 5B, and FIG. 5C represents the cross-section taken through the line BB' in FIG. 5B. In certain aspects, the source and drain regions 504 and 506 may be formed at edges of the fins 104 and 106 using epitaxial deposition, such that the source and drain regions 504 and 506 are formed as illustrated in FIGS. 5B and 5C. While FIG. 5C illustrates the cross-section taken through the drain region 506, a similar formation may be implemented for the source region 504. In certain aspects, the source/drain regions may be formed using Silicon-Carbon and/or Silicon-Germanium either with in-situ doping or external doping using arsenic (As), phosphorus (P), difluoroboryl (BF2) and boron (B) followed by rapid thermal treatment. The source and drain epitaxy mask alignment may be set to form a dielectric layer at area 502 to avoid such epitaxy formation on the entirety of the fin body. Also, in certain aspects where fin-to-fin spacing is kept at a low fin pitch, the epi around the fin shown in FIG. 5C may be attached together.

In some aspects, both the source and drain regions can be formed with an n-doped or a p-doped region to form MOSFETs. In some cases, two terminal MOS capacitors may be formed where source and drain regions are shorted together to use as one terminal, where the gate is used as the second terminal of the capacitor. In certain other aspects, the source region (or drain region) may be n-doped, and the drain region (or source region) may be p-doped, such that the semiconductor device 100 is configured as a variable capacitor. The variable capacitor may be a transcap device which generally refers to a three-terminal variable capacitor wherein one of the terminals is a control terminal that can be used to control a capacitance between the other two terminals of the transcap device. For example, a voltage may be applied to the source region 504 (also referred to as a control region) to adjust a capacitance between the non-insulative region 122 and the drain region 506.

Figure 6:
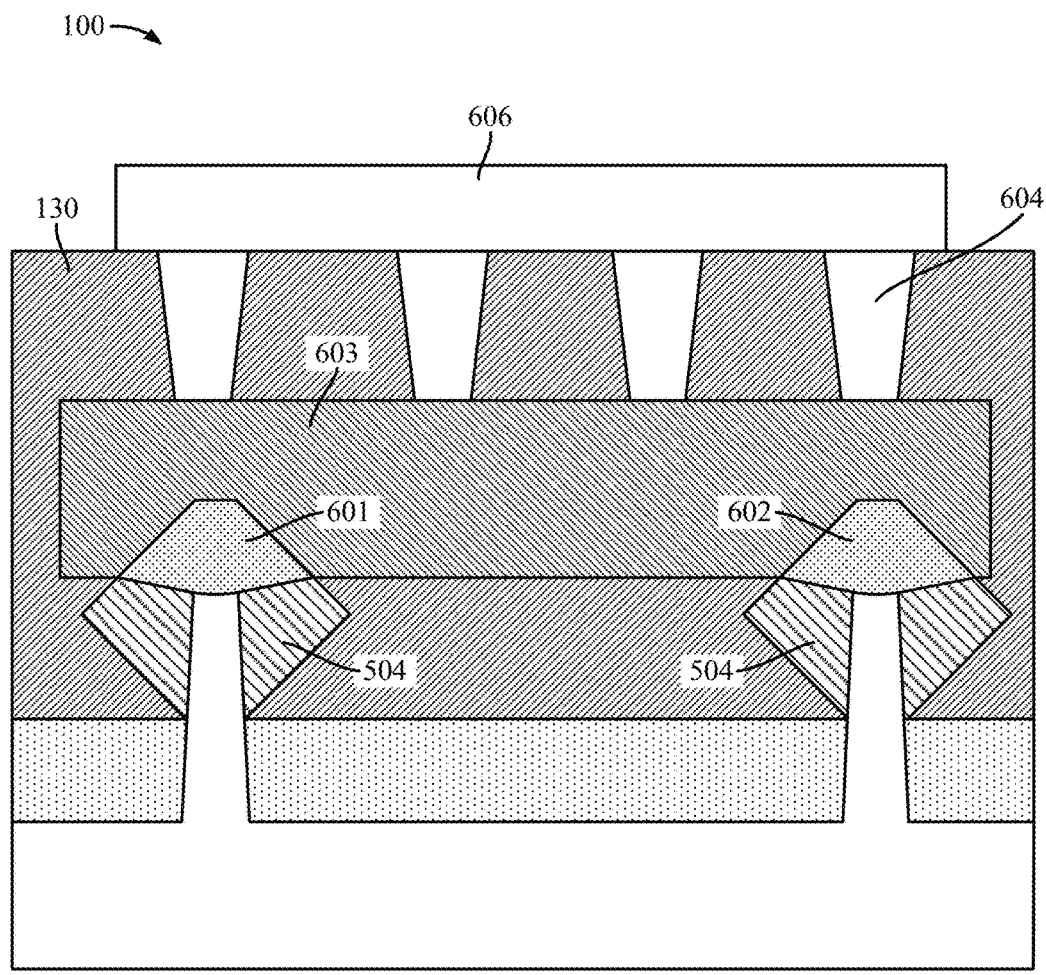
FIG. 6 illustrates the cross-section taken through source regions of the example semiconductor device of FIG. 1, in accordance with certain aspects of the present disclosure.

FIG. 6 illustrates the cross-section of the semiconductor device 100 along the source region 504, in accordance with certain aspects of the present disclosure. As illustrated, silicide layers 601 and 602 and a metal trench 603 are formed to make contact with the source region 504. For example, one or more contacts 604 are formed in the ILD material 130 to make contact between the metal 606 and the silicide layers 601 and 602.

Figure 7:
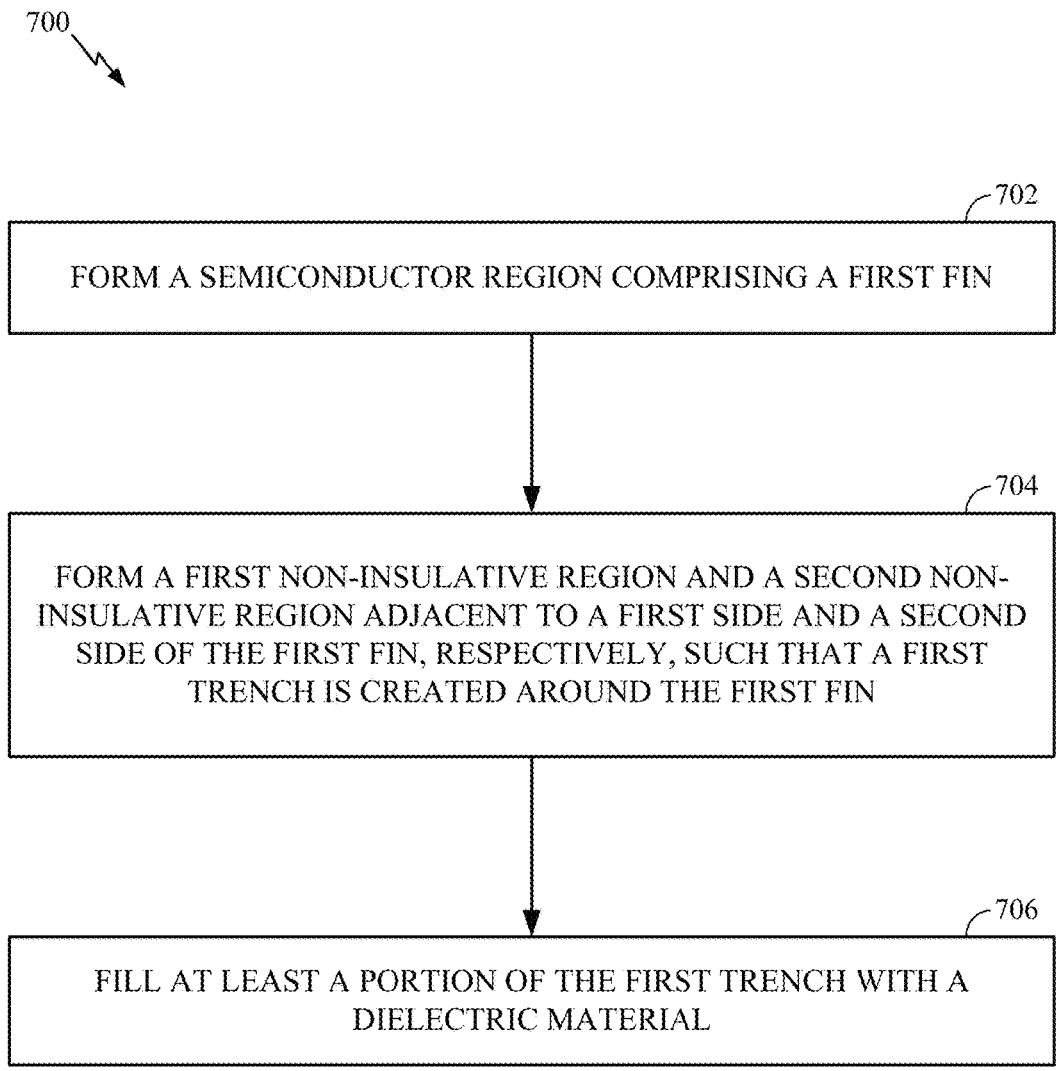
FIG. 7 is a flow diagram of example operations for fabricating a device, in accordance with certain aspects of the present disclosure.

FIG. 7 is a flow diagram of example operations 700 for fabricating a device, in accordance with certain aspects of the present disclosure. The operations 700 may be performed, for example, by a semiconductor processing chamber.

The operations 700 may begin, at block 702, by forming a semiconductor region (e.g., semiconductor region 102) comprising a fin (e.g., fin 104), and at block 704, forming a first non-insulative region (e.g., non-insulative region 121) and a second non-insulative region (e.g., non-insulative region 122) adjacent to a first side and a second side of the fin, respectively, such that a trench (e.g., trench 116) is created around the fin. At block 706, at least a portion of the trench is filled with a dielectric material (e.g., dielectric material 112).

In certain aspects, the operations 700 also include forming a first dielectric layer (e.g., dielectric layer 140) and first work function layer (e.g., work function layer 120) between the first non-insulative region and the first side of the fin, and forming a second dielectric layer and second work function layer between the second non-insulative region and the second side of the fin. In certain aspects, the first and second dielectric layers comprise high-k (HK) dielectrics, the first and second work function metal layers and the first and second non-insulative regions comprise metal gates (MG). In certain aspects, the dielectric material comprises silicon nitride or a low-K spacer used in the technology In certain aspects, the operations 700 also include forming a first insulative region (e.g., insulative region 110) and a second insulative region (e.g., insulative region 111). In this case, the first non-insulative region is formed above the first insulative region, the second non-insulative region is formed above the second insulative region, and the first insulative region and the second insulative region are separated by the fin. In certain aspects, the operations 700 may also include forming a first contact and a second contact, wherein the first contact is coupled to the first non-insulative region and the second contact is coupled to the second non-insulative region.

In certain aspects, the semiconductor region may include another fin (e.g., fin 106) and the second non-insulative region is disposed adjacent to a first side of the other fin. In this case, the operations 700 also include forming a third non-insulative region (e.g., non-insulative region 123) adjacent to a second side of the other fin such that another trench (e.g., trench 118) is created around the other fin, and filling at least a portion of the other trench with another dielectric material (e.g., dielectric material 114).

In certain aspects, the operations 700 also include forming a third non-insulative region (e.g., source region 504) adjacent to a first edge of the fin, and forming a fourth non-insulative region (e.g., drain region 506) adjacent to a second edge of the fin. In this case, the third non-insulative region may include an n-doped region, and the fourth non-insulative region may include a p-doped region to form a transcap device.

Figure 8:
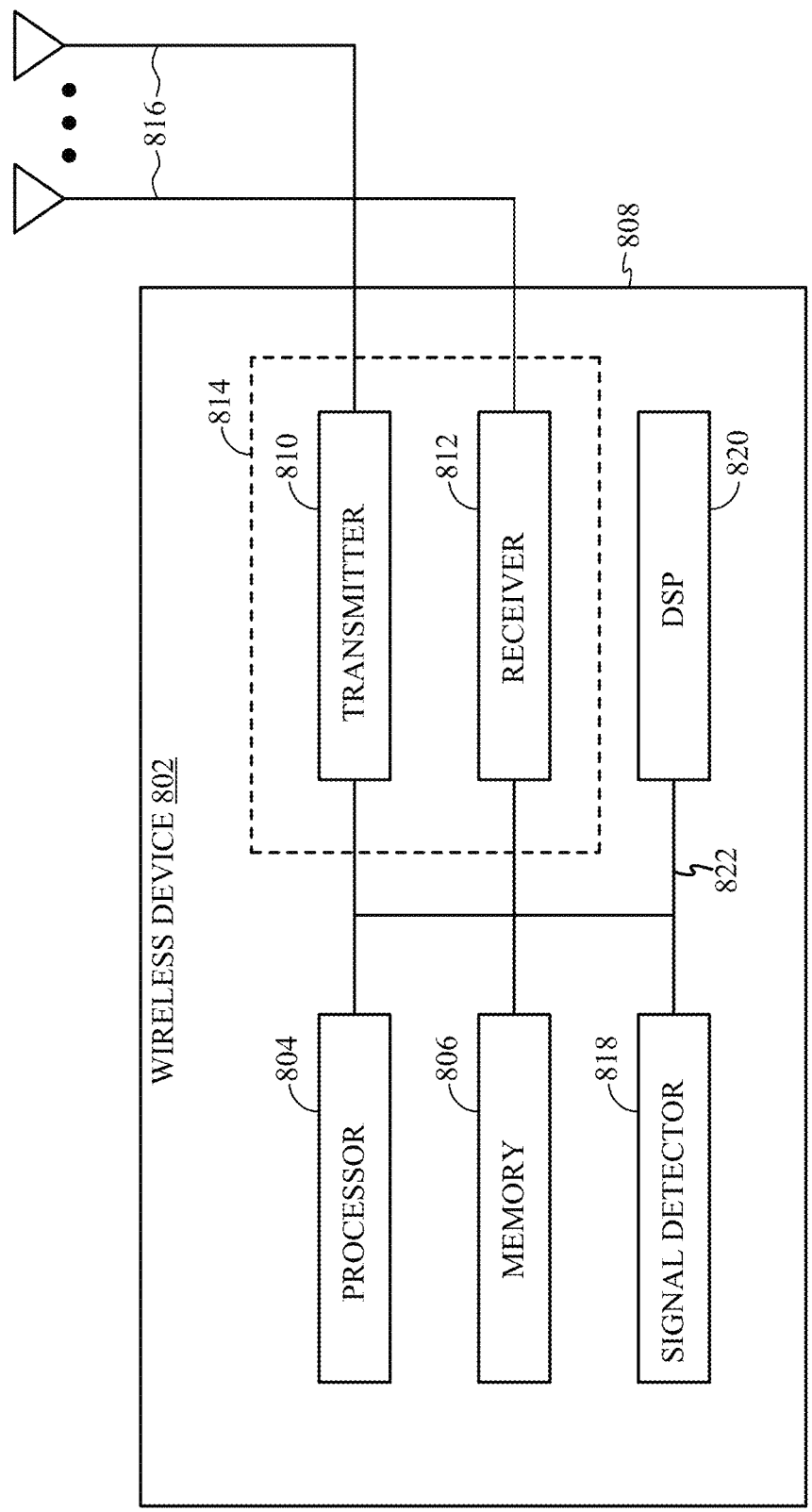
FIG. 8 illustrates a wireless device, in accordance with certain aspects of the present disclosure.

FIG. 8 illustrates various components that may be used in a wireless device 802 (e.g., mobile device). The wireless device 802 is an example of a device that may include the semiconductor device 100. That is, the wireless device 802 may include one or more circuits, implemented with semiconductor devices having a configuration as described with respect to the semiconductor device 100. For example, the wireless device 802 may include a processor 804 which controls operation of the wireless device 802. The processor 804 may also be referred to as a central processing unit (CPU). Memory 806, which may include both read-only memory (ROM) and random access memory (RAM), provides instructions and data to the processor 804. A portion of the memory 806 may also include non-volatile random access memory (NVRAM). The processor 804 typically performs logical and arithmetic operations based on program instructions stored within the memory 806. The instructions in the memory 806 may be executable to implement the methods described herein.

The wireless device 802 may also include a housing 808 that may include a transmitter 810 and a receiver 812 to allow transmission and reception of data between the wireless device 802 and a remote node. In some cases, such as a half-duplex system (e.g., WLAN), the transmitter 810 and the receiver 812 may be combined. The transmitter 810 and receiver 812 may be combined into a transceiver 814. A single or a plurality of transmit antennas 816 may be attached to the housing 808 and electrically coupled to the transceiver 814. The wireless device 802 may also include (not shown) multiple transmitters, multiple receivers, and multiple transceivers.

The wireless device 802 may also include a signal detector 818 that may be used in an effort to detect and quantify the level of signals received by the transceiver 814. The signal detector 818 may detect such signals as total energy, energy per subcarrier per symbol, power spectral density and other signals. The wireless device 802 may also include a digital signal processor (DSP) 820 for use in processing signals.

The various components of the wireless device 802 may be coupled together by a bus system 822, which may include a power bus, a control signal bus, and a status signal bus in addition to a data bus.

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components with similar numbering.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A semiconductor device, comprising:
a semiconductor region comprising a fin;
a first non-insulative region disposed adjacent to a first side of the fin and above a portion of the semiconductor region;
a second non-insulative region disposed adjacent to a second side of the fin and above another portion of the semiconductor region, wherein the first non-insulative region and the second non-insulative region are separated by a trench such that the first non-insulative region and the second non-insulative region are electrically isolated, at least a portion of the trench being filled with a dielectric material disposed directly adjacent to a portion of the first side of the fin, a portion of the second side of the fin, and a top side of the fin, the first and second sides of the fin being lateral sides of the fin, wherein:
the semiconductor region comprises another fin;
the second non-insulative region is disposed adjacent to a first side of the other fin;
the semiconductor device further comprises a third non-insulative region disposed adjacent to a second side of the other fin, wherein the second non-insulative region and the third non-insulative region are separated by another trench, at least a portion of the other trench being filled with another dielectric material disposed around the other fin; and
the dielectric material forms a notch above the fin, the semiconductor device further comprising a dielectric region disposed above the first non-insulative region, the second non-insulative region, and the fin, wherein a portion of the dielectric region is disposed in the notch above the fin formed by the dielectric material; and
an insulative layer spanning from the second side of the fin to the first side of the other fin, wherein the insulative layer and the dielectric material are separate regions, and wherein a portion of the dielectric material is disposed above the insulative layer.

2. The semiconductor device of claim 1, further comprising:
a first dielectric layer disposed between the first non-insulative region and the first side of the fin; and
a second dielectric layer disposed between the second non-insulative region and the second side of the fin.

3. The semiconductor device of claim 2, wherein:
the first and second dielectric layers comprise high-k (HK) dielectrics; and
the first and second non-insulative regions comprise metal gates (MG).

4. The semiconductor device of claim 1, wherein the dielectric material comprises nitride.

5. The semiconductor device of claim 1, further comprising a contact coupled to each of the first non-insulative region and the second non-insulative region.

6. The semiconductor device of claim 1, further comprising:
a fourth non-insulative region disposed adjacent to a first edge of the fin; and
a fifth non-insulative region disposed adjacent to a second edge of the fin.

7. The semiconductor device of claim 6, wherein:
the fourth and fifth non-insulative regions comprise n-doped regions or p-doped regions; and
the semiconductor device is configured as a fin field effect transistor (FINFET).

8. The semiconductor device of claim 6, wherein:
the fourth and fifth non-insulative regions are shorted together; and
the semiconductor device is configured as a capacitor.

9. A semiconductor device, comprising:
a semiconductor region comprising a fin;
a first non-insulative region disposed adjacent to a first side of the fin;
a second non-insulative region disposed adjacent to a second side of the fin, wherein the first non-insulative region and the second non-insulative region are separated by a trench such that the first non-insulative region and the second non-insulative region are electrically isolated, at least a portion of the trench being filled with a dielectric material disposed around the fin;
a third non-insulative region disposed adjacent to a first edge of the fin; and
a fourth non-insulative region disposed adjacent to a second edge of the fin, wherein:
the third non-insulative region comprises an n-doped region;
the fourth non-insulative region comprises a p-doped region;
the semiconductor device is configured as a variable capacitor; and
the dielectric material forms a notch above the fin, the semiconductor device further comprising a dielectric region disposed above the first non-insulative region, the second non-insulative region, and the fin, wherein a portion of the dielectric region is disposed in the notch above the fin formed by the dielectric material.

10. A mobile device, comprising:
one or more semiconductor devices, wherein each of the one or more semiconductor devices comprises:
a semiconductor region comprising a fin;
a first non-insulative region disposed adjacent to a first side of the fin and above a portion of the semiconductor region;

a second non-insulative region disposed adjacent to a second side of the fin and above another portion of the semiconductor region, wherein the first non-insulative region and the second non-insulative region are separated by a trench such that the first non-insulative region and the second non-insulative region are electrically isolated, at least a portion of the trench being filled with a dielectric material disposed directly adjacent to a portion of the first side of the fin, a portion of the second side of the fin, and a top side of the fin, the first and second sides of the fin being lateral sides of the fin, wherein:

the semiconductor region comprises another fin;

the second non-insulative region is disposed adjacent to a first side of the other fin;

the semiconductor device further comprises a third non-insulative region disposed adjacent to a second side of the other fin, wherein the second non-insulative region and the third non-insulative region are separated by another trench, at least a portion of the other trench being filled with another dielectric material disposed around the other fin; and the dielectric material forms a notch above the fin, the semiconductor device further comprising a dielectric region disposed above the first non-insulative region, the second non-insulative region, and the fin, wherein a portion of the dielectric region is disposed in the notch above the fin formed by the dielectric material; and an insulative layer spanning from the second side of the fin to the first side of the other fin, wherein the insulative layer and the dielectric material are separate regions, and wherein a portion of the dielectric material is disposed above the insulative layer.

* * * * *